United States Patent
Filipovic

(10) Patent No.: US 7,320,103 B2
(45) Date of Patent: Jan. 15, 2008

(54) DIAGNOSTIC DATA GATHERING APPARATUS AND METHOD

(75) Inventor: Dragan Filipovic, Arlington Heights, IL (US)

(73) Assignee: Kraft Foods Holdings, Inc., Northfield, IL (US)

( * ) Notice: Subject to any disclaimer, the term of this patent is extended or adjusted under 35 U.S.C. 154(b) by 500 days.

(21) Appl. No.: 10/924,576

(22) Filed: Aug. 24, 2004

(65) Prior Publication Data

US 2006/0048025 A1    Mar. 2, 2006

(51) Int. Cl.
*G06F 11/00* (2006.01)
(52) U.S. Cl. ...................................... 714/799
(58) Field of Classification Search ............... 714/799, 714/798, 775, 809, 814, 821, 55, 51, 47, 714/39, 712
See application file for complete search history.

(56) References Cited

U.S. PATENT DOCUMENTS

| | | | |
|---|---|---|---|
| 5,097,470 A * | 3/1992 | Gihl | 714/55 |
| 5,111,410 A * | 5/1992 | Nakayama et al. | 434/258 |
| 5,414,455 A * | 5/1995 | Hooper et al. | 725/88 |
| 6,611,724 B1 * | 8/2003 | Buda et al. | 700/49 |
| 6,691,064 B2 * | 2/2004 | Vroman | 702/183 |
| 6,910,054 B1 * | 6/2005 | Herbst et al. | 707/205 |
| 7,035,768 B2 * | 4/2006 | Matsuda | 702/184 |

* cited by examiner

*Primary Examiner*—Guy Lamarre
*Assistant Examiner*—Fritz Alphonse
(74) *Attorney, Agent, or Firm*—Fitch, Even, Tabin & Flannery

(57) ABSTRACT

Process data and video data as pertains to the operation of an item of equipment is received and temporarily captured and stored in a rolling window that includes a plurality of different points in time. Upon detecting a predetermined operating condition of interest with respect to the item of equipment, at least a portion of the data as then presently appears in the rolling window is non-temporarily stored to render such data available for subsequent analysis. These steps are then preferably reset to permit automated and unattended capture of similar information as corresponds to future operating conditions of interest.

33 Claims, 4 Drawing Sheets

DIAGNOSTIC DATA GATHERING APPARATUS AND METHOD

TECHNICAL FIELD

This invention relates generally to the capture of diagnostic data as it pertains to the operation of an item of equipment.

BACKGROUND

Various kinds of equipment are known in the art. Essentially all equipment is subject to failure or partially-failed operational states. In general, simpler mechanisms (i.e., those with few parts and/or operational states) are easier to analyze and diagnose when such a condition arises. In many cases, however, the equipment in question can pose formidable challenges to fault-causation identification. For example, some equipment is comprised of thousands (or tens of thousands) of individual components and can further comprise a complicated mixture of mechanical, electrical, electromechanical, chemical, and software-based elements. While it can sometimes be readily ascertained that a fault has occurred with such equipment, identifying the cause of such a fault can be quite difficult (and may require highly trained on-site experts, expensive diagnostic equipment, and considerable down-time for the equipment being studied).

One simple approach to this problem essentially entails a reactive forensic review of a present state of a piece of equipment at or subsequent to the time of failure. That is, trained (or untrained) individuals exam various aspects, conditions, and states of the equipment and from this review try and glean a possible cause for the acknowledged failure. Such an approach, while successful in some settings, becomes increasingly less effective and acceptable as the complexity of the equipment increases. Not only can such a review be highly time consuming but may also fail in its primary purpose—to reliably identify a root cause (or causes) of a given fault.

Another approach provides for ongoing recordation of one or more data points regarding operation of the equipment. For example, a comprehensive record of these data points may be maintained during operation of the equipment being monitored. This approach, of course, can require massive amounts of memory and can further entail considerable time and effort to interpret due, at least in part, to the large amounts of data (much of which is likely irrelevant to the cause being sought) generated by this approach.

The so-called black box recorder on modern aircraft represents another approach. By this tactic, only a certain amount of data, over time, is captured. For example, in many cases data older than a thirty minute window is discarded on a first-in/first-out basis. In the black box of an aircraft, for example, the recording process concludes in the event of a catastrophic failure. This yields a reduced amount of data that leads up to the fault of interest and that will hopefully include sufficient information to aid in identifying the cause of the fault. For some purposes this approach represents a viable strategy. In other settings, however, this approach can be less than satisfactory.

In a modern manufacturing facility, for example, even a considerable fault that brings the equipment in question to a halt rarely results in utter subsequent inoperability. Instead, a jammed mechanism, for example, can be cleared and the equipment restarted. To the extent that such jamming may recur from time to time can be economically vexing and require an explanation and a solution, but, again, the equipment is nevertheless able to serve its intended purpose at least in a degraded fashion. Unfortunately, prior techniques for recording data in such a setting often provide insufficient information to support a useful cause analysis in such a setting. The data itself may be somewhat (or wholly) ambiguous with respect to cause and effect. In short, known data gathering techniques can provide too little useful (or too much irrelevant) information and, by its very nature, can be ill-suited for application in non-catastrophic equipment failure settings.

BRIEF DESCRIPTION OF THE DRAWINGS

The above needs are at least partially met through provision of the diagnostic data gathering apparatus and method described in the following detailed description, particularly when studied in conjunction with the drawings, wherein.

Figure 1:
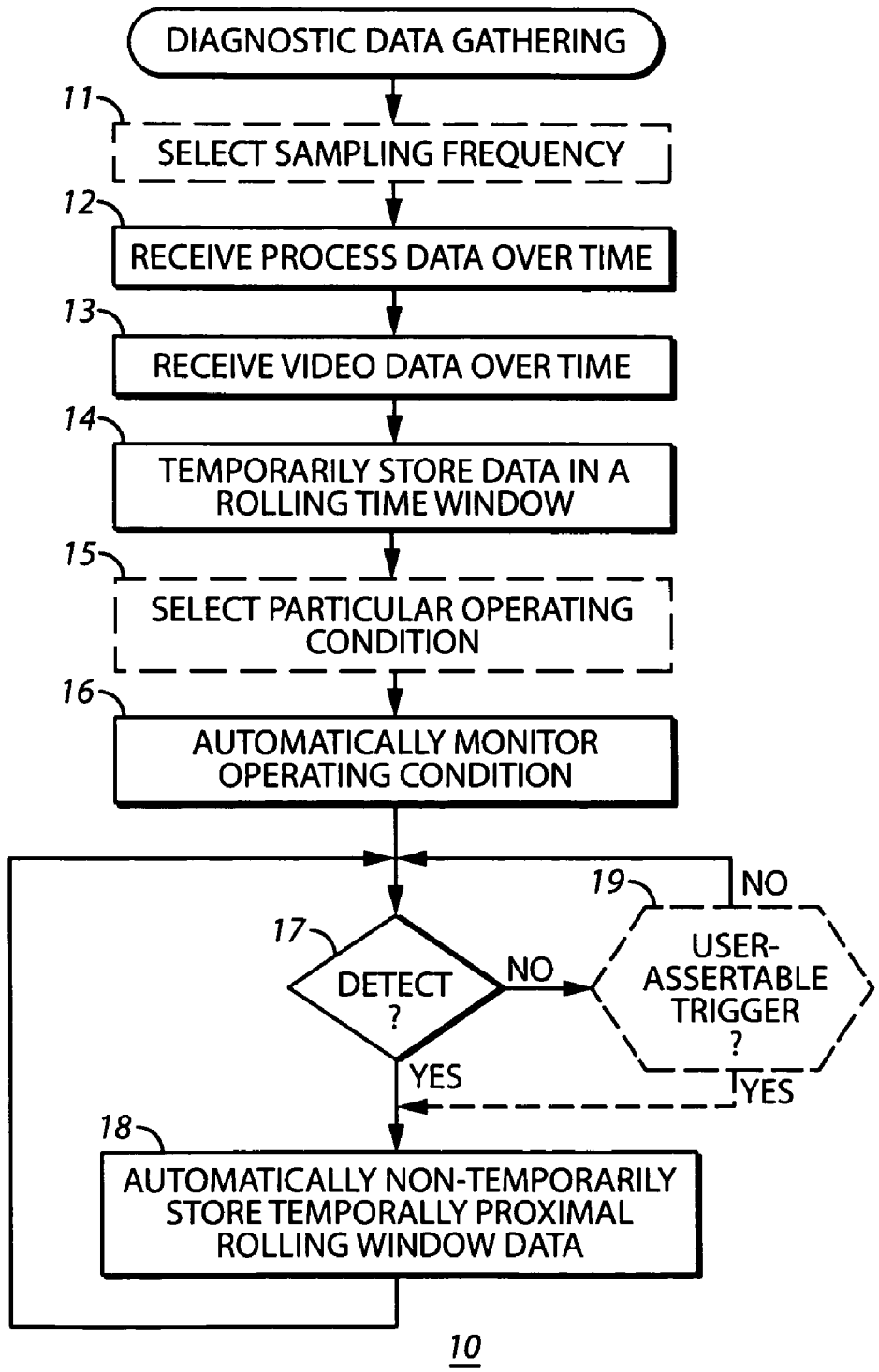
FIG. 1 comprises a flow diagram as configured in accordance with various embodiments of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will also be understood that the terms and expressions used herein have the ordinary meaning as is usually accorded to such terms and expressions by those skilled in the corresponding respective areas of inquiry and study except where other specific meanings have otherwise been set forth herein.

DETAILED DESCRIPTION

Generally speaking, pursuant to these various embodiments, a diagnostic data gathering method for use with at least one item of equipment provides for the reception of both process data (at a plurality of different points in time and wherein "process data" is understood to comprise digital process data, analog process data, or both) as corresponds to operation of the item of equipment and video data (also at a plurality of different points in time) as also corresponds to operation of the item of equipment. Such data is temporarily stored in a rolling window that includes a plurality of the different points in time. This approach then automatically monitors at least a first predetermined operating condition with respect to the item of equipment, and, upon detecting the first predetermined operating condition, automatically non-temporarily stores at least a plurality of the process data and the video data as appears in the rolling window at a time that is at least temporally proximal to when the first predetermined operating condition is detected to provide a captured window of process data and video data.

Pursuant to a preferred approach, the process then continues to monitor the equipment and capture additional subsequent rolling windows of data on a non-temporary basis in response to subsequent operating condition events. So configured, this process can automatically capture only likely-relevant windows of data as pertain to the failures of a given item of equipment over some period of time (such as, for example, one week or one month). At the end of such a monitoring period, the captured non-temporarily stored data can be collected and reviewed to facilitate a causative analysis regarding the equipment in question.

This approach permits long term unattended monitoring of an item of equipment in a manner that neither interferes with ordinary operation, maintenance, and/or attention to the equipment nor that itself requires attention from floor personnel or others. Notwithstanding such long term monitoring capability, this process does not tend to generate overtly large quantities of mostly useless or irrelevant data. And, by capturing such data for multiple corresponding equipment events of interest, it can be easier in many cases for an analyst to identify meaningful correlations and thereby identify the cause (or causes) responsible for the events of concern.

These and other benefits will become clearer upon making a thorough review and study of the following detailed description. Referring now to the drawings, and in particular to FIG. 1, a diagnostic data gathering process 10 can optionally comprise, if desired, selection 11 of a sampling frequency (or frequencies) as pertains to one or more of the data/video inputs (described below). For example, one or more process data inputs may have a plurality of different candidate sampling frequencies associated therewith; this optional step 11 permits selection of a given one of those sampling frequencies to thereby permit control over resultant granularity of the captured data.

This process 10 then provides for capturing 12 process data at a plurality of different points in time as corresponds to operation of a corresponding monitored item of equipment (or, if desired, a plurality of such items of equipment). Pursuant to one preferable approach, such process data has a substantially continuous presence with capture of that data occurring pursuant to a schedule of choice. Pursuant to another approach, the process data arrives in a periodic fashion—for example, every ten milliseconds.

Any number of discrete process data streams can be so accommodated. For example, pursuant to a preferred approach, 256 discrete digital inputs are so accommodated. The process data itself can comprise any available and potentially useful data as corresponds to an action, condition, monitored parameter, state, or instruction as pertains to the equipment. Some examples of potentially useful data sources include, but are not limited to, programmable logic controller outputs, inputs, control strategy states and the like, relays, optical beam sensors, movable object travel-sensitive stops and sensors, Hall effect sensors, and so forth, to name a few.

In some cases, it may be desirable to simply receive 12 all available process data streams as correspond to a given item of equipment. In other cases, a more selective choice may be exercised. For example, although an exact cause for a given equipment event of concern may not be known, the operator may nevertheless be reasonably certain that the cause is owing to a particular sub-portion of the item of equipment and may therefore elect to only receive process data as corresponds to that particular sub-portion.

This process 10 also provides for receiving 13 video data as also corresponds to operation of the item of equipment. And again, this process 10 receives such video data at a plurality of different points in time. In a preferred embodiment, a plurality of such video streams can be so received (such as, for example, two, four, or more such feeds). Pursuant to a preferred approach the video streams themselves are already digitized (using, for example, a standard such as MPEG 4 or the like) to thereby facilitate their ready storage as per these teachings. In the alternative, however, one or more of the video streams can comprise an analog signal provided this step of receiving 13 include a digitizing capability. (It would of course be possible to optionally receive an analog video signal and to store it using analog storage facilities such as video tape, but such an approach will likely yield sub-optimum results in many settings.)

If desired, the video data can be captured in common with capture of the process data. By this approach, if the process captures process data every ten milliseconds, then the video data would be captured at the same time. In general, however, this will likely provide more video data information than has beneficial use. Accordingly, although this process 10 will be shown below to favor storing such process data and video data in synchronicity with one another with respect to their corresponding original occurrences in time, this process will preferably receive such video data with somewhat reduced frequency. For example, while process data can be usefully received once every 10 milliseconds, video data can be usefully received once every 33 milliseconds.

Figure 2:
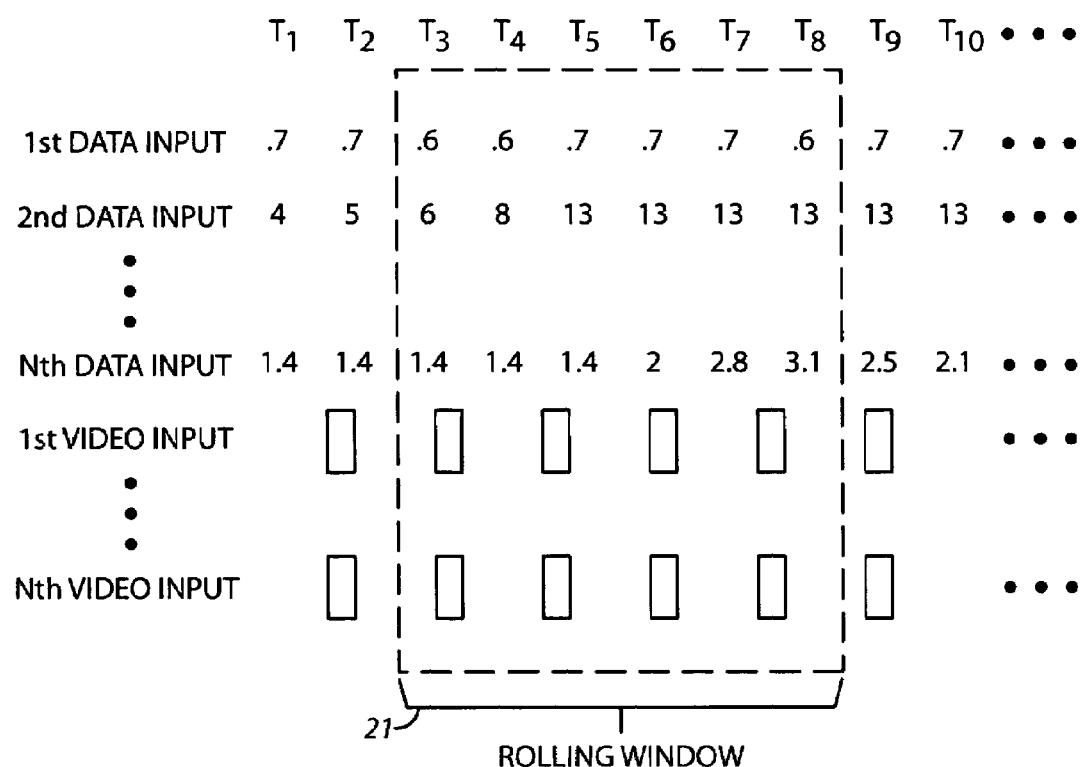
FIG. 2 comprises a schematic representation of data flow over time with respect to a memory as configured in accordance with various embodiments of the invention.

This process 10 then temporarily stores 14 the process data and the video data in a rolling window that includes a plurality of different points in time. This step can perhaps be better illustrated with momentary reference to FIG. 2. At various times (such as every 10 milliseconds) such as $T_1$, $T_2$, and so forth as depicted, process data is received as described above. As noted, this can include a first data input, a second data input, and so forth up to and including an Nth data input (such as a $256^{th}$ data input). (Note: for purposes of illustration this data is shown here in an alphanumeric form; i.e., "0.7," "4," "1.4" and so forth.) This process data is sequentially ordered into and essentially through a storage medium (such as one or more memories). More particularly this data passes into and through a storage area representing a rolling window 21 of such data. In a preferred approach this rolling window 21 has a user-programmable duration to thereby permit a user to select a specific rolling window duration from amongst a range of candidate values. For example, a user could be permitted to select a rolling window duration of from one second to 30 seconds (for many applications, a duration of about ten seconds will be appropriate). Other duration ranges could of course be utilized if desired to meet the requirements or anticipated needs of a given application or setting.

As time passes and exceeds the duration of the rolling window 21, process data will be expunged from the rolling window 21 (preferably on a first-in/first-out basis). So configured, in a preferred approach, at any given moment the rolling window 21 will contain the most recent sequential process data as is proximal to a present moment in time.

In a similar fashion, video data (such as a first video input through an Nth video input as depicted) will also pass through the rolling window. Although it is not necessary that the video data match identical moments in time as correspond to capture of the process data stream elements, it is preferred that such video data be stored in temporal synchronicity with the process data.

To facilitate subsequent use and analysis, it is preferred that such data be temporarily stored in at least the rolling window 21 in a temporally consistent and understandable manner. By one approach, each data capture event (such as the moment when the data as corresponds to each process data input is captured and stored) is correlated to a given corresponding identified discrete point in time. By another approach each item of process data and video data can be stored in conjunction with a corresponding time stamp. By yet another approach the consistent periodicity of the capture/storage process can itself be relied upon to establish, at a minimum, a temporal framework within which unfolding events as evidenced by the captured data can be understand and examined.

So configured and arranged, this process 10 receives both process data and video data and temporarily stores those streams of information in synchronicity with one another in a rolling window of time. In a preferred approach, "old" data (i.e., data that has exited the rolling window of time) is simply deleted. Consequently, a relatively small memory can suffice for these purposes notwithstanding the potential for a significant number of both process and several video inputs.

Referring again to FIG. 1, an operator optionally selects 15 one or more particular operating conditions from amongst a plurality of different operating conditions to thereby provide an operating condition to be monitored. If desired, the process 10 can optionally be provided with a default operating condition to serve this purpose when no specific operating condition has been so selected or otherwise identified or programmed. The process 10 then automatically monitors at least this operating condition with respect to the item of equipment.

This operating condition of interest can be essentially any condition of interest or concern and will vary amongst items of equipment. Possible examples of such operating conditions include but are not limited to excessive temperatures, under or over pressure conditions, particular atmospheric contents, excessive (or absent) vibration, mechanical or electrical switch triggers, and so forth. The operating condition of interest can be rendered as a function of, or independent of, the process data as is otherwise provided and received pursuant to these teachings. For example, if desired, the operating condition of interest can comprise a particular temporal, sequential, and/or contemporaneous combination of two or more monitored items of process data (such as temperature for a given area and item proximity at another specific area of the monitored equipment).

Upon detecting 17 such an operating condition, the process 10 then automatically non-temporarily stores 18 at least a plurality of the process data and the video data as then appears in the rolling window of time. This, in turn, provides for non-temporary capture of data that is at least temporally proximal to when the predetermined operation condition is detected. In a preferred approach this data is shifted to another memory location (such as a second memory) to readily facilitate such non-temporary retention. (As used herein, it can be seen that "non-temporary" contrasts with the "temporary" storage provided by the rolling window of data practice. The latter provides for storage of data for the duration of the rolling window, but longer storage is not required. Since the rolling window itself tends to be quite brief, it is "temporary." The "non-temporary" storage need not be permanent (as in non-erasable memory) but is intended to persist for considerably longer than the duration of the rolling window. For example, in a given application it may be reasonable to expect to retain such captured data for a day, a week, a month, or longer.)

Following the capture of data within a given rolling window of time and transfer of that information to longer term storage in response to a triggering event as described, this process 10 then preferably automatically essentially resets itself and begins again to automatically monitor 16 the operating condition of interest. (It would also be possible, of course, to program the process 10 to utilize a different operating condition as a subsequent trigger event following a first trigger event.) Pursuant to one approach, this resetting of the process could include automatically deleting any process data and/or video data as was received prior to and/or subsequent to the rolling window that was non-temporarily stored to thereby permit the process to begin from a given point with a cleared rolling window buffer.

As described, the process 10 provides for non-temporarily storing a rolling window's worth of data automatically upon detecting a predetermined operating condition. If desired, this process 10 can also optionally account for a user-assertable trigger. Upon detecting 19 a user-assertable trigger, the process 10 can then again provide for the automatic non-temporary storage 18 of the data then present within the rolling window of time. This, in turn, will permit an operator to effect manually a data snapshot to thereby test the process and/or to substitute for a predetermined operating condition.

Figure 3:
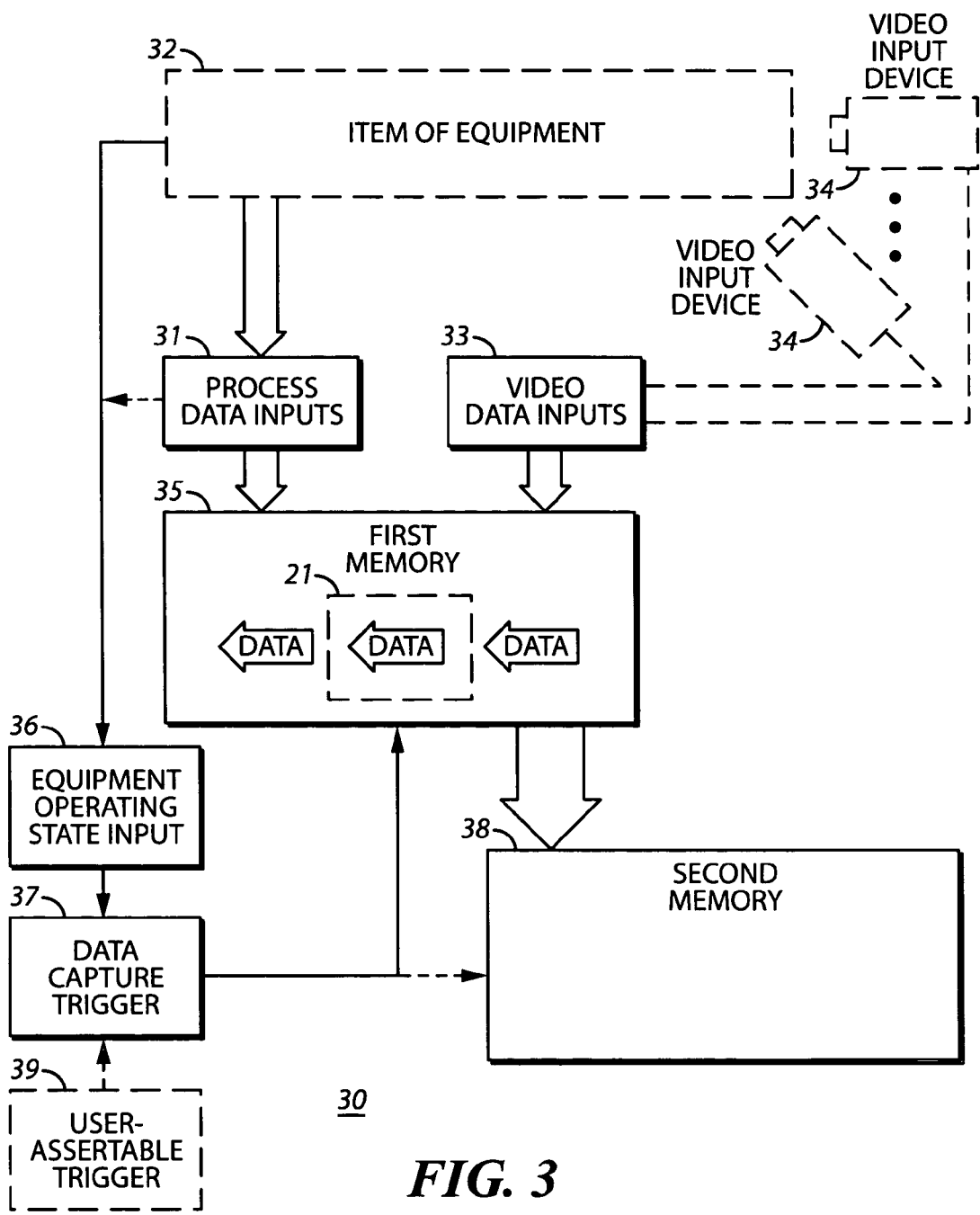
FIG. 3 comprises a block diagram as configured in accordance with various embodiments of the invention.

Such a process can be realized and embodied in a variety of ways. Referring now to FIG. 3, a system embodiment to illustrate as least some potential exemplary supporting platforms will be described.

This exemplary diagnostic data gathering apparatus 30 includes a plurality of equipment operation process data inputs 31 that are, in this illustrative example, operably coupled to the process data inputs (such as inputs that are provided to the controllers for the item of equipment) and/or outputs (such as command signals for machine motors, actuators, and the like for the item of equipment) of a single piece/item of equipment 32. Various existing platforms can be used to meet this need including digital input/output cards having 32 inputs per card as are manufactured by National Instruments. In a given configuration some or all of these digital data inputs can operate compatibly with a communication subsystem standard such as Ethernet or Data Highway Plus as supported by Rockwell Software.

This apparatus 30 also includes one or more equipment operation video data inputs 33 that operably couple to video input devices 34 (having, for example, a pixel resolution of 640 by 480). In a preferred embodiment these video input devices 34 effectively comprise still video capture devices (though in fact can comprise 30 frame per second video cameras as are often used to capture so-called live action) and are typically positioned to provide a view of a portion of the item of equipment 32. For example, if a present problem includes jamming at a particular location of the equipment 32, these video input devices 34 can be positioned, oriented, aimed, and focused to provide one or more views of that particular location and/or other locations that may be of interest with respect to seeking a cause (or consequence) of such jamming. The video input devices can be full color, monochromatic, or any other color scheme (such as enhanced artificial color as may be used with an infrared based video input platform). Such video input devices and mounting techniques are well understood in the art and therefore further elaboration will not be provided here for the sake of brevity and the preservation of focus with respect to this description.

The diagnostic data gathering apparatus 30 further comprises a first memory 35 that couples to the plurality of digital equipment operation data inputs 31 and the equipment operation video data inputs 33 in order to temporarily store the above-described rolling window 21 of data comprising such data as corresponds to a plurality of different points in time (preferably in a sequential manner). This first memory 35 can comprise a single memory module or can comprise a plurality of memory modules. It would also be possible to embody part or all of this first memory 35 using remotely located memory facilities as versus on-site facilities and/or to provide for redundant temporary storage. The size of the memory should of course be sufficient to accommodate at least the maximum anticipated quantity of data. For example, when supporting 256 discrete digital data inputs, 512 MB of storage capability may be appropriate. Such configuration options are well understood by those skilled in the art and require no further elaboration here. (It may also be noted here that such memory management can be readily facilitated and supported in any of a wide variety of known ways including, for example, by use of a personal computer (having a desktop, laptop, or rackmount form factor) (not shown) running a real-time operating system such as Windows 2000 as will be understood and recognized by those skilled in the art.) These digital data inputs should typically be provided with optical isolation in accordance with well-understood prior art technique.

An equipment operating state input 36 also operably couples to the item of equipment 32. This coupling can be a direct one to the item of equipment 32 itself (for example, to a specific input/output port of a programmable logic controller) or can comprise, in combination with such a direct link or in lieu thereof, a link to one or more of the process data inputs 31. The particular equipment operating state (or states) to be monitored in a given instance will of course vary with the equipment itself and the nature of the problem to be diagnosed or issue to be studied. In some cases a very limited number of points of observation may be sufficient whereas in other cases it may be necessary or useful to monitor for a larger plurality of different conditions.

A data capture trigger 37 then operably couples to the equipment operating state input 36. The data capture trigger 37 responds to the monitored equipment operating state information by, for example, causing movement of at least portions of a present (or near-term) rolling window 21 of data as is temporarily stored in the first memory 35 to be moved to a second memory 38. In a preferred approach such movement is at least substantially contemporaneous with the occurrence of the operating state (or states) of interest. Also in a preferred embodiment, such movement entails moving all portions of the rolling window of data as versus only some subset thereof, though the latter approach can be used if desired. In effect, this data capture trigger 37 captures a data/video snapshot that encompasses data within the rolling window 21 in response to detecting an event of interest or concern.

Figure 4:
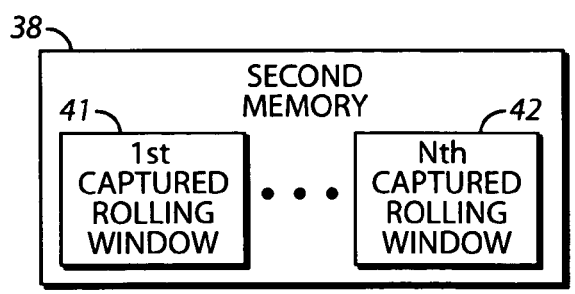
FIG. 4 comprises a block diagram as configured in accordance with various embodiments of the invention.

For example, when the monitored condition comprises a jammed condition at a particular location within the item of equipment 32, upon detecting this jammed condition via the equipment operating state input 36 the data capture trigger 37 will cause the process and video data leading up to that jammed condition (as is then presently temporarily contained in the rolling window 21) to be non-temporarily stored in the second memory 38. Making momentary reference to FIG. 4, this second memory 38 can again be sized to meet the anticipated requirements of a given application but will preferably have ample capacity to accommodate a plurality of so-captured data events. For example, as shown, the second memory 38 can store a first captured rolling window 41 and, in addition, up to an additional N number of captured rolling windows 42 (where N is typically an integer value such as ten, fifty, one hundred, and so forth). As with the first memory 35, the second memory 38 can comprise a single integrated platform or can be realized through use of multiple memory modules, and can also be either locally provided or partially or fully remotely located.

Unlike the first memory 35, where incoming data poses the likely consequence of corresponding data removal (in accord with a first-in/first-out temporary storage mechanism), the second memory 38 does not, preferably, depose previously stored captured rolling windows in favor of newer data. Instead, such data snapshots are retained unless and until an operator elects to effect their removal. The second memory 38 may comprise, for example, a 20 GB memory.

Figure 5:
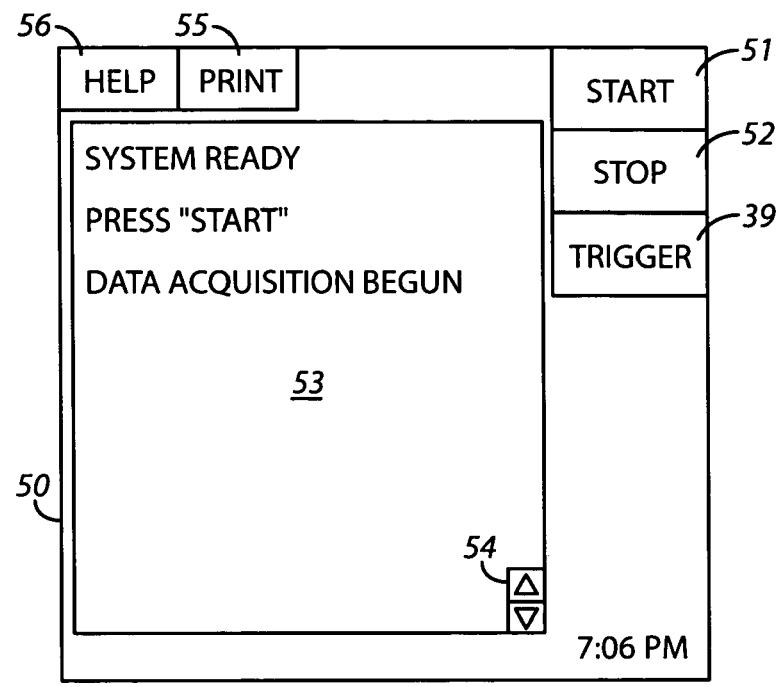
FIG. 5 comprises a front elevational schematic view of a control/display panel as configured in accordance with various embodiments of the invention.

Referring again to FIG. 3, it may also be desirable to optionally include a user-assertable trigger 39. The data capture trigger 37 can be rendered responsive as well to such a user-assertable trigger 39 such that assertion of the user-assertable trigger 39 will cause a rolling window snapshot to be non-temporarily stored in the second memory 38. Such a user-assertable trigger 39 can be provided in a number of viable ways. By one approach, and referring now to FIG. 5, a touch screen display 50 can include such a trigger 39 along with other potentially useful inputs or outputs. For example, as illustrated, a START 51 and STOP 52 switch can be provided to permit a user to initiate the above-described process and to stop the above-described process (pursuant to a preferred approach, the user-assertable trigger 39 can also be enabled or disabled by the START 51 and STOP 52 switches). A display area 53 can serve a variety of functions. For example, feedback regarding present and/or prior status, actions, and/or commands can be displayed using text, imagery, or some combination thereof. Scrolling buttons 54 can be provided in accordance with well understood prior art technique to permit such information to be scrolled and thereby facilitate ready access to information that might not be presently displayed. Such a user interface can also include, for example, a HELP 56 button (to obtain helpful information regarding operation of the diagnostic data gathering apparatus and the like), a PRINT 55 button (to facilitate printing, for example, information presently (or previously) displayed in the display area 53), and other command buttons to facilitate successful use and interaction with the apparatus.

So configured, such an apparatus can receive a stream of process data as corresponds to operation of an item of equipment and a stream of video data as also corresponds to operation of the item of equipment via the process and video data inputs 31 and 33. The first memory 35 can then receive and temporarily store those streams of process and video data as occur during a relatively brief rolling window of time. Upon detecting at least one predetermined operating condition (via the equipment operating state input 36), the data capture trigger 37 can then automatically cause the stream of process and video data as is then temporarily stored in the first memory as corresponds to the rolling window 21 of time to be transferred to and non-temporarily stored in the second memory 38. The apparatus can then automatically reset itself and begin monitoring for a next occurrence of the (or a) operating condition of interest.

These capabilities and behaviors, in turn, readily permit unattended operation of the apparatus. Once properly interfaced to the item (or items) of equipment of concern, the apparatus can be activated and left unsupervised. At some later time an operator can extract the captured data as has been non-temporarily stored in the second memory 38 (either on-site or remotely) to conduct an analysis of the data as part of an effort to identify a cause or causes for an undesired operating condition. Upon concluding the exercise, the apparatus is then readily detached from the item of equipment and either stored or moved to another item of equipment for another monitoring activity.

As described, the diagnostic data gathering apparatus resides on-site and likely relatively proximal to the item of equipment to be monitored. In many cases this will no doubt be preferred due to a potential multitude of interconnections between these components. In some cases, however, it might be preferred to so monitor the item of equipment from a remote location. In such a case, it will likely be preferable to arrange for a communication link as between the item of equipment and the diagnostic data gathering apparatus that will tend to assure the accuracy and validity of not only the stored data elements themselves but their captured temporal relationships with respect to one another.

Figure 6:
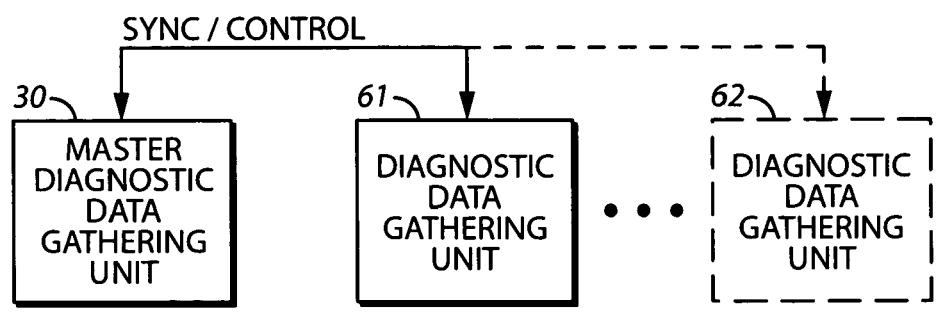
FIG. 6 comprises a block diagram as configured in accordance with various embodiments of the invention.

Also as described, a single diagnostic data gathering apparatus can be used with one or more items of equipment. Given the relatively prodigious input capabilities of the described preferred embodiment, such configurations will likely suffice for many or most scenarios. On occasion, however, the number of process data inputs and/or video feeds may exceed the input capacity of a single such diagnostic data gathering apparatus. In such a case, and referring now to FIG. 6, multiple diagnostic data gathering apparatus can be used to monitor the item (or items) of equipment. Though such monitoring can be done in a discrete fashion, in a preferred approach the data stored by each will be synchronized to the data as stored in the other platforms. One way to effect this result is to configure and program one of the diagnostic data gathering units as a master diagnostic data gathering unit 30. When operating in such a mode, the master unit 30 will source synchronization signals (such as a master clock signal) and/or control signaling (such as START, STOP, TRIGGER and other commands such as these) to the remaining diagnostic data gathering units 61 and 62.

By facilitating the receipt and capture of a wealth of pre-event data during a relevant (but relatively short) period of time at least somewhat prior to an event of interest, these teachings can greatly facilitate an analysis of why the event occurred. These teachings require no modification of the control software for the item of equipment being studied and may be implemented in a highly portable and re-usable platform.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept. For example, the above described process can further accommodate analog signal inputs as correspond to the operation of the item of equipment (many older pieces and even many newer items of manufacturing equipment utilize control equipment that make use of analog sensors that provide an analog signal output such as a range of current values that correspond to a range of control settings or responses). Such an option can permit accommodation of useful signals that are not otherwise provided in a digital format. In such a case, the analog signal(s) will preferably be digitized to facilitate its storage as per the above-described process. As another option, multiple rolling windows of varying duration can be offered. For example, an operator could select from amongst, for example, a one second rolling window, a five second rolling window, a ten second rolling window, a 30 second rolling window, and so forth. As another example, this process can be rendered sensitive to two different operating conditions. So configured, a first rolling window duration (of, say, five seconds) could be used when storing data as temporally corresponds to a first operating condition trigger and a second rolling window duration (of, say, ten seconds) could be used when storing data as temporally corresponds to a second, different operating condition trigger.

I claim:

1. A diagnostic data gathering method for use with at least one item of equipment, comprising:
   receiving process data at a plurality of different points in time as corresponds to operation of the item of equipment;
   receiving video data at a plurality of different points in time as corresponds to operation of the item of equipment;
   temporarily storing the process data and the video data in a rolling window that includes a plurality of the different points in time including at least 5 seconds of the process data and video data just previous to a present time;
   automatically monitoring at least a first predetermined operating condition with respect to the item of equipment;
   upon detecting the first predetermined operating condition, automatically non-temporarily storing at least a plurality of the process data and the video data as appears in the rolling window at a time that is at least temporally proximal to when the first predetermined operating condition is detected to provide a captured window of process data and video data.

2. The method of claim 1 wherein receiving process data further comprises receiving process data regarding states of a plurality of different mechanical elements of the item of equipment.

3. The method of claim 1 wherein receiving video data further comprises receiving at least two separate video feeds as correspond to two separate video cameras.

4. The method of claim 1 wherein receiving video data further comprises receiving still video images.

5. The method of claim 1 wherein:
   receiving process data further comprises receiving process data samples at a first frequency of sampling;
   receiving video data further comprises receiving video data samples at a second frequency of sampling, which second frequency of sampling is different than the first frequency of sampling.

6. The method of claim 5 wherein temporarily storing the process data and the video data in a rolling window that includes a plurality of the different points in time further comprises temporarily storing the process data and the video data in a rolling window that comprises a rolling window of dynamically user-programmable duration.

7. The method of claim 1 wherein monitoring at least a first predetermined operating condition with respect to the item of equipment further comprises monitoring at least a first predetermined operating condition as corresponds to a failure state for the item of equipment.

8. The method of claim 7 wherein the failure state for the item of equipment comprises a jam condition.

9. The method of claim 1 and further comprising automatically deleting process data and video data as was received subsequent to the rolling window and which process data and video data was not otherwise non-temporarily stored.

10. The method of claim 1 wherein temporarily storing the process data and the video data further comprises temporarily storing the process data and the video data in synchronicity with one another.

11. The method of claim 1 and further comprising:
selecting a sampling frequency for receiving the process data from amongst a plurality of different sampling frequencies;
and wherein receiving the process data further comprises receiving the process data in accordance with the sampling frequency.

12. The method of claim 1 and further comprising:
selecting a particular operating condition from amongst a plurality of different operating conditions to be the first predetermined operating condition.

13. The method of claim 1 wherein monitoring at least a first operating condition with respect to the item of equipment further comprises monitoring a plurality of operating conditions with respect to the item of equipment.

14. The method of claim 13 wherein upon detecting the first predetermined operating condition, non-temporarily storing at least a plurality of the process data and the video data further comprises, upon detecting any of the plurality of operating conditions, non-temporarily storing the at least a plurality of the process data and the video data.

15. The method of claim 1 and further comprising:
providing a user-assertable trigger;
upon detecting assertion of the user-assertable trigger, non-temporarily storing at least a plurality of the process data and the video data as appears in the rolling window at a time that is at least temporally proximal to when the user-assertable trigger is detected to provide a captured window of process data and video data.

16. A diagnostic data gathering apparatus comprising:
a plurality of equipment operation process data inputs;
a plurality of equipment operation video data inputs;
a first memory operably coupled to the plurality of equipment operation process data inputs and the plurality of equipment operation video data inputs and having temporarily stored therein a rolling window of data comprising equipment operation process data and equipment operation video data as correspond to a plurality of different points in time including at least 5 seconds of equipment operation process data and equipment operation video data just previous to a present time;
an equipment operating state input;
a second memory operably coupled to the first memory and having non-temporarily stored therein a captured data event comprising at least portions of at least one rolling window of data as was temporarily stored in the first memory at a time that was at least substantially contemporaneous with occurrence of a predetermined equipment operating state;
a data capture trigger operably coupled to the equipment operating state input and being operably coupled to the first memory.

17. The diagnostic data gathering apparatus of claim 16 wherein at least some of the plurality of equipment operation process data inputs are operably coupled to process data outputs of a single piece of equipment.

18. The diagnostic data gathering apparatus of claim 17 wherein at least some of the plurality of equipment operation video data inputs are each operably coupled to a video input device.

19. The diagnostic data gathering apparatus of claim 18 wherein at least one of the video input devices is positioned to provide a view of a portion of the single piece of equipment.

20. The diagnostic data gathering apparatus of claim 16 wherein at least one of the plurality of equipment operation video data inputs comprises a still video data input.

21. The diagnostic data gathering apparatus of claim 20 wherein all of the plurality of equipment operation video data inputs comprise still video data inputs.

22. The diagnostic data gathering apparatus of claim 16 wherein the rolling window of data as non-temporarily stored in the first memory comprises equipment operation process data and equipment operation video data that are stored in synchronicity with one another with respect to their corresponding original occurrences in time.

23. The diagnostic data gathering apparatus of claim 16 wherein the second memory has sufficient capacity to store a plurality of the captured data events.

24. The diagnostic data gathering apparatus of claim 16 and further comprising:
a user-assertable trigger;
and wherein the data capture trigger is further operably coupled to the user-assertable trigger.

25. The diagnostic data gathering apparatus of claim 16 wherein the data capture trigger further comprises trigger means for responding to a predetermined equipment operating state as detected via the equipment operating state input.

26. The diagnostic data gathering apparatus of claim 25 wherein responding to the predetermined equipment operating state comprises moving at least portions of a rolling window of data as is temporarily stored in the first memory at a time that is at least substantially contemporaneous with occurrence of the predetermined equipment operating state to the second memory for non-temporary storage as a captured data event.

27. The diagnostic data gathering apparatus of claim 26 wherein moving at least portions of the rolling window of data further comprises moving all portions of the rolling window of data.

28. A diagnostic data gathering apparatus comprising:
process data input means for receiving a stream of process data as corresponds to operation of an item of equipment;
video data input means for receiving a stream of video data as corresponds to operation of the item of equipment;
a first memory for receiving the process data and the video data and for temporarily storing at least 5 seconds of the stream of process data and the stream of video data as occurs during a rolling window of time;
a second memory;
operating condition trigger means for receiving trigger information regarding at least one predetermined operating condition as regards the item of equipment and for providing a trigger signal in response to detecting the at least one predetermined operating condition to cause the stream of process data and the stream of video data as is then temporarily stored in the first memory as corresponds to the rolling window of time to be transferred to and non-temporarily stored in the second memory.

29. The diagnostic data gathering apparatus of claim 28 wherein the video data input means is further for receiving a plurality of streams of video data as corresponds to operation of the item of equipment.

30. The diagnostic data gathering apparatus of claim 29 wherein the streams of video data comprises streams of still video images.

31. The diagnostic data gathering apparatus of claim 28 wherein the rolling window of time is about ten seconds.

32. The diagnostic data gathering apparatus of claim 28 wherein the second memory has sufficient capacity to non-temporarily store the process data and the video data as correspond to a plurality of rolling windows of time.

33. The diagnostic data gathering apparatus of claim 28 wherein the first memory is further for receiving the process data and the video data and for temporarily storing the stream of process data in synchronicity with the stream of video data as occurs during the rolling window of time.

* * * * *